United States Patent [19]
Howard

[11] Patent Number: 4,739,823
[45] Date of Patent: Apr. 26, 1988

[54] HEAT EXCHANGER STRUCTURE

[75] Inventor: Robert W. Howard, Anaheim, Calif.

[73] Assignee: McDonnell Douglas, Long Beach, Calif.

[21] Appl. No.: 670,067

[22] Filed: Nov. 9, 1984

[51] Int. Cl.$^4$ .......................... H01L 23/46; F28F 3/12
[52] U.S. Cl. ........................................ 165/56; 165/41; 165/104.34; 165/169; 165/905; 165/76; 244/117 A
[58] Field of Search ............... 244/117 A, 158 A, 163; 165/44, 41, 76, 104.34, 56, 905, 169; 52/588, 578, 518, 519, 762, 249, 785, 792

[56] References Cited

U.S. PATENT DOCUMENTS

| | | | |
|---|---|---|---|
| 845,550 | 2/1907 | Hunter | 52/588 X |
| 1,251,950 | 1/1918 | Ames et al. | 52/519 X |
| 2,923,384 | 2/1960 | Black | 52/588 |
| 2,941,759 | 6/1960 | Rice et al. | 165/41 X |
| 2,956,785 | 10/1960 | Riehl | 257/124 |
| 3,013,641 | 12/1961 | Compton | 165/41 X |
| 3,024,941 | 3/1962 | Vandenberg | 165/41 X |
| 3,089,318 | 5/1963 | Hebiler | 165/41 X |
| 3,126,718 | 3/1964 | Flamand | 244/117 A |
| 3,243,150 | 3/1966 | Woodcock | 244/163 X |
| 3,246,689 | 4/1966 | Remde | 165/53 |
| 3,321,154 | 5/1967 | Downs | 244/117 A |
| 3,612,447 | 10/1971 | Newsom | 244/117 A |
| 3,776,305 | 12/1973 | Simmons | 165/41 X |
| 3,977,206 | 8/1976 | Simmons | 244/117 A X |
| 4,057,104 | 11/1977 | Altoz | 244/117 A X |
| 4,125,340 | 11/1978 | Klaus et al. | 52/588 X |
| 4,211,047 | 7/1980 | Briggs | 52/588 X |
| 4,377,198 | 3/1983 | Welling et al. | 165/41 X |

FOREIGN PATENT DOCUMENTS

| | | | |
|---|---|---|---|
| 602372 | 7/1960 | Canada | 244/117 A |
| 374182 | 2/1964 | Switzerland | 52/588 |
| 859057 | 1/1961 | United Kingdom | 244/117 A |
| 1582203 | 1/1981 | United Kingdom | 52/588 |

Primary Examiner—Albert W. Davis, Jr.
Attorney, Agent, or Firm—James M. Skorich; George W. Finch; John P. Scholl

[57] ABSTRACT

Avionics systems are cooled by circulating the heated air through an onboard closed loop system which includes a heat transfer envelope comprised of a liner and the fuselage of the flight vehicle. The liner keeps a constant, thermodynamically optimal passage height between the liner and the fuselage, and is contoured in order to maintain that optimal height between the liner and internal structural support members which abut the fuselage and pass through the heat transfer envelope. The liner is comprised of flexible interlocking liner sections, each of which is produced from the same mold using heat and flame resistant material and subsequently trimmed to precisely fit into its particular area. Each liner section has a convex ridge which fits over an interal structural support member to enclose the member within the heat exchange envelope. Each convex ridge has transverse flexible ribs which accept and removably grasp the support member, thereby removably attaching the liner section to the support member. Each liner section also has a lip which overlaps and presses down against the succeeding adjacent section to hold it firmly in place, while at the same time effecting a seal. This mode of installation requires no riveting or other mechanical fasteners, and provides for quick and easy removal to facilitate maintenance or repair requiring access to the interior surface of the fuselage.

17 Claims, 9 Drawing Sheets

HEAT EXCHANGER STRUCTURE

The Government has rights in this invention pursuant to Contract No. F33657-81-C-2108 awarded by the United States Air Force.

BACKGROUND OF THE INVENTION

1. Field of the Invention

This invention relates to heat exchangers used in flight vehicles to cool avionic equipment, and more particularly to a closed loop skin heat exchanger which maintains a constant, thermodynamically optimal gap between the fuselage skin and the onboard liner and, since rivets or mechanical fasteners are not employed, is easily installed and removed to provide ready access to the fuselage.

2. Description of the Prior Art

Presently, avionics systems are cooled by circulating the air heated by the systems through a radiator situated in a forward facing air scoop. The scoop breaches the otherwise smooth continuity of the skin of the aircraft, thus subjecting the aircraft to increased aerodynamic drag and negatively effecting the performance of the vehicle.

This solution is also prone to failure from the clogging of the scoop by foreign objects such as birds, or fracture of the radiator core by smaller objects. The probability of failure from clogging can be reduced by employing multiple scoop radiators, but this further increases aerodynamic drag. The probability of fracture of the radiator can be reduced by strengthening the material used in the core, but this entails increased expense and weight, the latter further penalizing the performance of the vehicle.

Conventional air conditioning also presents a means to cool the avionics equipment, but this apparatus is heavy, expensive, and requires constant maintenance. An air conditioning unit obtains the work necessary for its operation from a vehicle engine, and thus adversely effects the engine's performance and increases its fuel consumption.

Also used are cooling systems which simply direct cold ambient air over or through the equipment to be cooled. However, this solution exposes the equipment to the risk of contamination and damage from particulate matter and water.

Conventional skin heat exchangers create an envelope that includes the internal structural support members which abut and project above the fuselage skin by simply positioning a flat rigid liner high enough above the highest projecting support member to provide an air passage between the support member and the liner. This inevitably results in the distance between the liner and the skin being too high for efficient heat exchange; or, where the liner is positioned at a minimal distance above the projecting support member, a constriction of the flow through the envelope which similarly defeats efficient heat exchange.

Attempts to contour the liner to more closely follow the profile of the projecting support member as it rises above the level of the fuselage have used rigid metal fasteners to attach the contoured section of the liner to the projecting support member, as well as fasteners to attach the lower, level portion of the liner to the fuselage skin. Liners contoured and attached in this conventional fashion are heavy and also quite difficult and time consuming to remove and reinstall when maintenance or structural damage require access to the fuselage. Additionally, the means of attachment typically include rivets that pass through the fuselage and protrude above the otherwise smooth surface of the outer skin. This increases the aerodynamic drag of the aircraft and, additionally, creates stress risers, that is, locations in the skin where stress is increased, and, therefore, where the potential for structural failure is greatest. The fact that the liner is rigid and firmly attached to the structural support members and the skin also negatively effects skin and fuselage stress characteristics and performance parameters.

All conventional cooling apparatus are installed during the assembly of the flight vehicle because it is quite difficult and time consuming, if not impossible in some instances, to subsequently install them.

SUMMARY OF THE INVENTION

The present invention provides for the exchange of heat between the avionics equipment of a flight vehicle and the ambient atmosphere by circulating the air through a closed loop system which includes a heat exchange envelope having, as one side, a fuselage skin exposed to the ambient atmosphere and, as the opposite side, a flexible liner composed of a heat and flame resistant material.

Internal structural support members abut the fuselage skin throughout the vehicle, including the area of the skin employed as a side of the heat exchange envelope. The liner is contoured to enclose the support members within the envelope and maintain an air passage height between each support member and the liner approximating the thermodynamically optimal passage height maintained between the fuselage skin and the liner. Flexible ribs located in the contoured sections of the liner removably attach the liner to the support members. Vertical posts extending from the liner position the liner at the desired height above the fuselage skin, and also serve to create turbulence in the air flow and thereby further increase the heat exchange.

As the present invention uses the fuselage skin to exhaust heat, it does not incur the increased drag occasioned by the external air scoop of the conventional radiator systems, and it similarly avoids the weight penalties and expense attendant to the use of impact-resistant materials in the radiator core. As it is a closed loop system, it does not expose the avionics equipment to the risk of contamination or damage from elements carried by the ambient airstream.

Since the present invention is not dependent upon work from a vehicle engine to operate, it does not adversely affect engine fuel consumption or performance, nor does it entail the expense, weight and continual maintenance also associated with conventional air conditioning systems. The present invention uses a molded, contoured liner to keep the air gap at a constant, thermodynamically optimal value without relying on metal fasteners and rivets for its installation, and thus successfully avoids the problems of difficult, time consuming removal and installation, expense, weight, and stress risers in the fuselage skin, that plague conventional skin heat exchangers.

Due to the relative ease of installation of the present invention without the need for modifications to the structure of the flight vehicle, the present invention can be readily installed subsequent to the final assembly of the flight vehicle.

OBJECTS OF THE INVENTION

An object of the present invention is to efficiently and reliably cool the avionics equipment of a flight vehicle.

Another object of the present invention is to cool the avionics equipment without increasing the aerodynamic drag of the flight vehicle.

Yet another object of the present invention is to cool the avionics equipment using an apparatus that is light, inexpensive, and maintenance free.

A further object of the present invention is to cool the avionics equipment in a manner that does not expose the equipment to the risk of contamination or damage by particulate matter or water.

Another object of the present invention is to cool the avionics equipment using an apparatus that may be quickly and easily installed or removed, thereby providing ready access to the interior fuselage skin of the vehicle.

Still another object of the present invention is to cool the avionics equipment without adversely effecting engine performance or causing increased fuel consumption.

Yet another object of the present invention is to cool the avionics equipment without using an apparatus that requires metal fasteners, rivets, or otherwise breeches the outer skin of the vehicle.

Still another object of the present invention is to cool the avionics equipment without causing stress risers in the skin of the vehicle.

A further object of the present invention is to cool the avionics equipment by using a flexible liner that does not negatively affect the skin and fuselage stress characteristics and performance parameters.

Another object of the present invention is to cool the avionics equipment using a contoured liner which approximates the same thermodynamically optimal height for the passage between the liner and the interior fuselage skin, as for the gap between the liner and structural support members which abut and project above the skin.

Yet another object of the present invention is to cool the avionics equipment using a contoured liner which creates turbulence in the flow of medium in the passage between the contoured liner and the fuselage skin, and thereby increases the heat transfer between the medium and the fuselage skin.

A further object of the present invention is to cool the avionics equipment using a flexible liner comprised of identical interlocking sections that may be easily and quickly trimmed to obtain a precise fit into any particular fuselage location.

Still another object of the present invention is to cool the avionics equipment using a flexible liner comprised of sections that form a sealed fit with adjacent sections upon installation.

Another object of the present invention is to cool the avionics equipment with an apparatus that can be readily installed subsequent to the final assembly of the flight vehicle.

Other objects, advantages and novel features of the invention will become apparent from the following detailed description of the invention when considered in conjunction with the accompanying drawings wherein:

DESCRIPTION OF THE PREFERRED EMBODIMENTS

Figure 1:
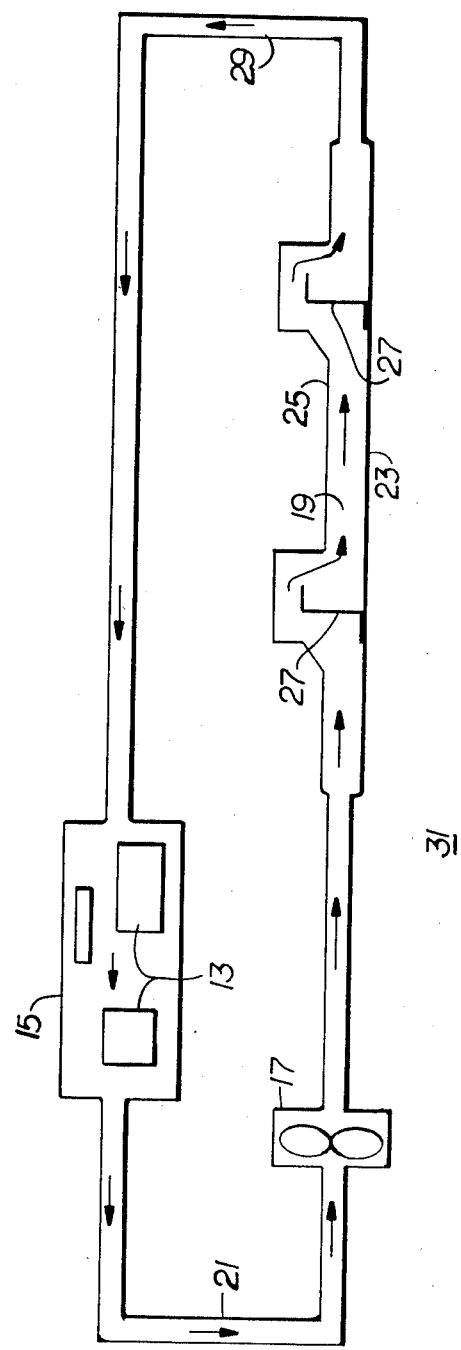
FIG. 1 is a schematic illustration of the present invention.

Turning to the schematic illustration of the present invention shown in FIG. 1, avionics equipment 13 is contained in container 15, and container 15 communicates flow of medium with in line fan 17 and skin heat exchanger envelope 19 by means of exhaust duct 21. Envelope 19 is a sealed envelope formed by the volume contained between aircraft fuselage skin 23, liner 25, and the forward and aft vertical aircraft bulkheads (not shown). Longitudinal structural support longerons 27 abut skin 23 and are enclosed within envelope 19. Envelope 19 also communicates flow of medium with container 15 through collector duct 29, thus completing a closed loop.

In operation, air heated by the operation of avionics equipment 13 is exhausted from compartment 15 through exhaust duct 21 and through envelope 19 by means of the pressure differential created by the operation of fan 17. As the hot air passes through envelope 19, heat transfer occurs through skin 23 between the hot air and cold ambient atmosphere 31. This causes the temperature of the air to drop by the time it leaves envelope 19 and returns through collector duct 29 to container 15 to cool avionics equipment 13.

Figure 2:
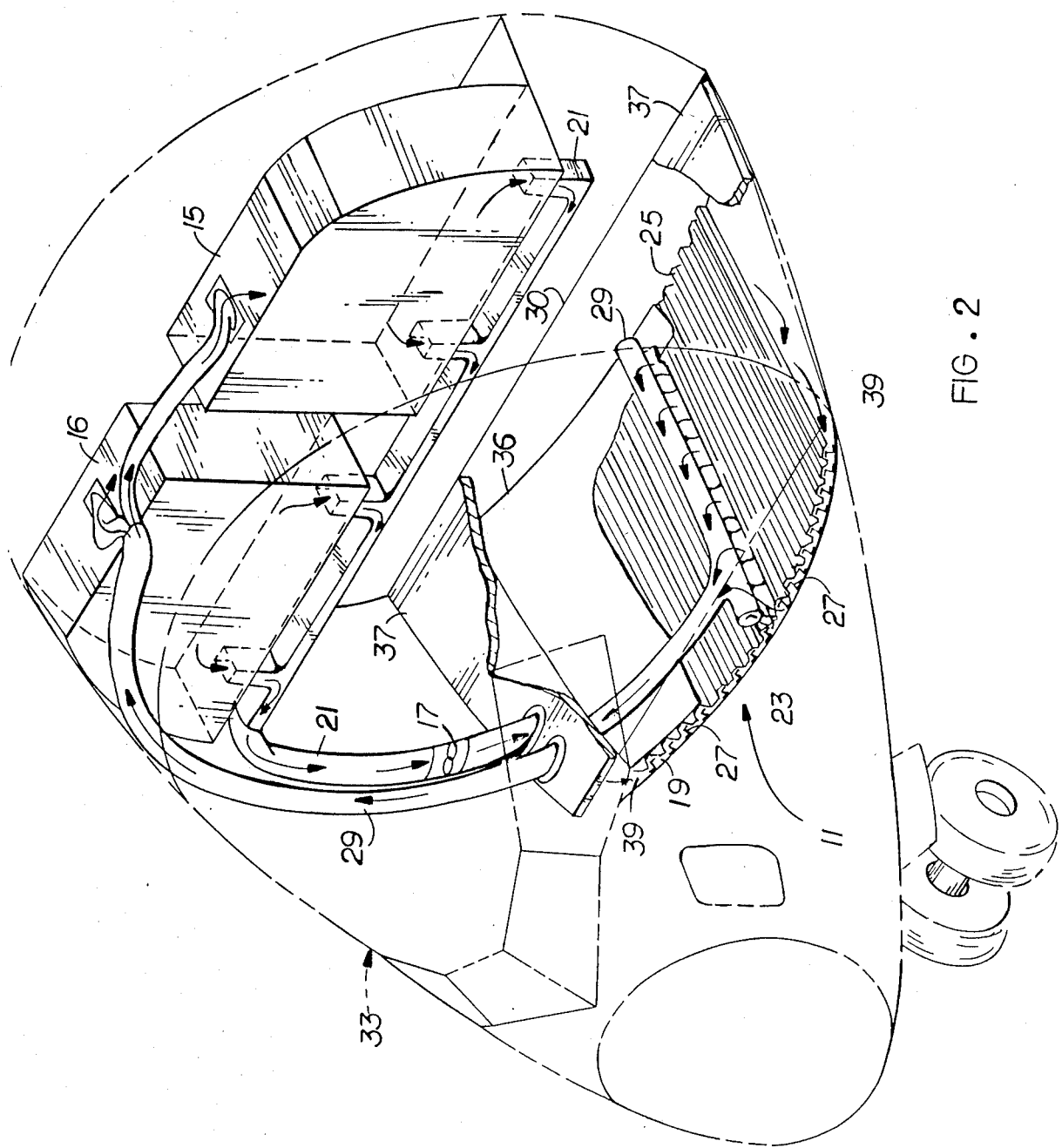
FIG. 2 is a fragmentary perspective view of a cross section of a preferred embodiment of the present invention operationally installed in an aircraft shown in phantom.
Figure 3:
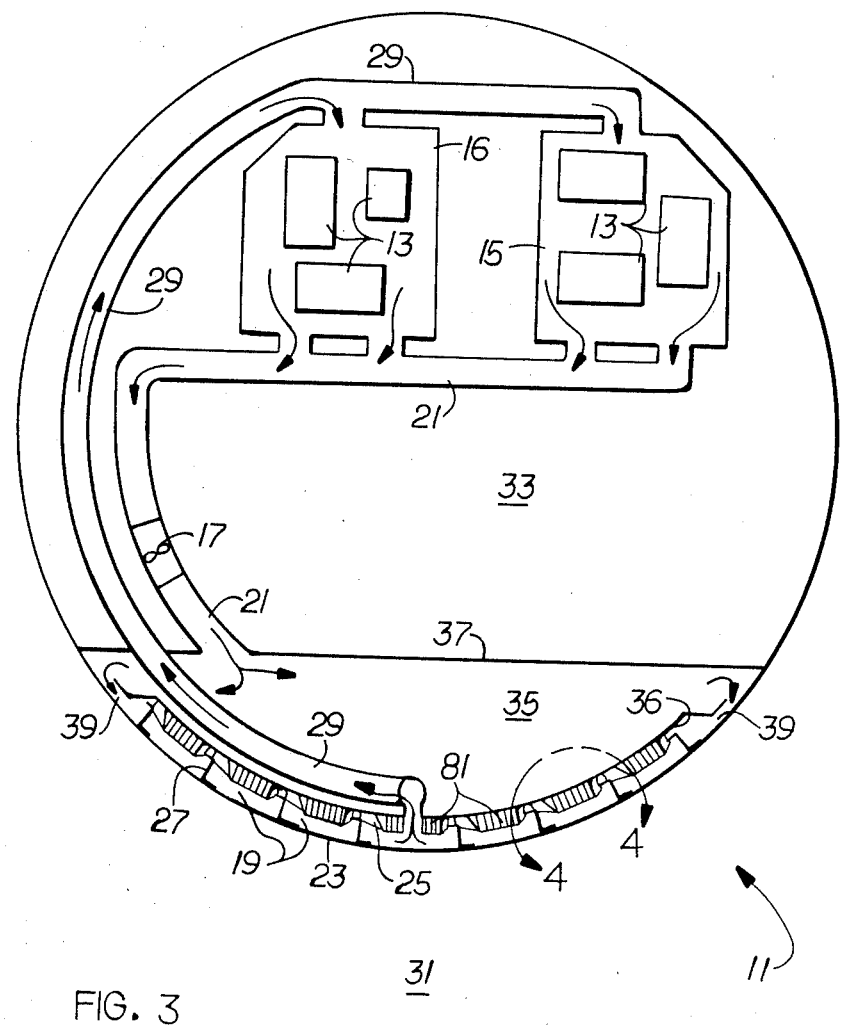
FIG. 3 is a front sectional view of a preferred embodiment of the present invention operationally installed in the bay of an aircraft.

FIGS. 2 and 3 show preferred embodiment 11 of the present invention operationally installed in aircraft 33 (shown in phantom in FIG. 2), with FIG. 2 providing a perspective view and FIG. 3 a front sectional view taken along a vertical plane at a forward station.

Liner 25 is composed of flexible heat and fire resistant material, and bends to conform to the concave curvature of fuselage skin 33. Longerons 27 are longitudinal support members that run parallel to each other in the middle of aircraft 33, and converge as they approach the nose. Liner cover 36 is a flexible board abutting the highest vertical projections (the convex ridges) of liner 25 and covering its entire longitudinal length and lateral breadth. Floorboard 37 is a stiff board running laterally from one side of the fuselage to the other, and longitudinally from vertical aft bulkhead 30 to the vertical forward bulkhead (not shown).

Plenum 35 is contained by floorboard 37, liner cover 36, the vertical forward bulkhead, and aft bulkhead 30;

and communicates flow of medium with envelope 19 through open envelope ends 39. Hot air is drawn from containers 15 and 16 and forced through exhaust duct 21 and into plenum 35 by means of fan 17. Due to the pressure differential between plenum 35 and envelope 19, the hot, high pressure air in plenum 35 flows through open envelope ends 39 and into and through envelope 19, where the air is cooled by heat transfer occurring by conduction through skin 23. Collector duct 29 communicates flow of air with envelope 19 above the lowest point in the aircraft bay, and returns the cooled air to containers 15 and 16.

Figure 4:
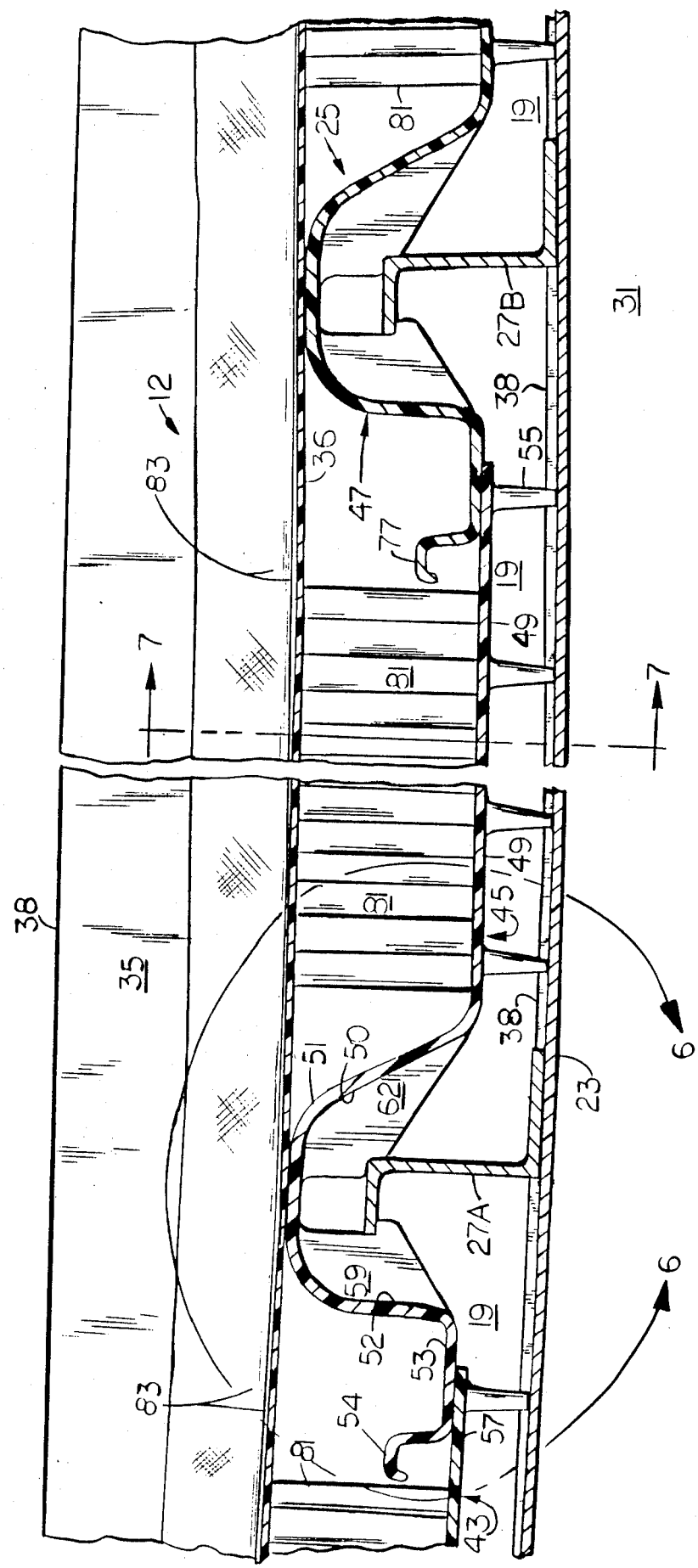
FIG. 4 is an enlarged fragmentary sectional view of the area of the preferred embodiment enclosed by arrow 4 in FIG. 3.
Figure 5:
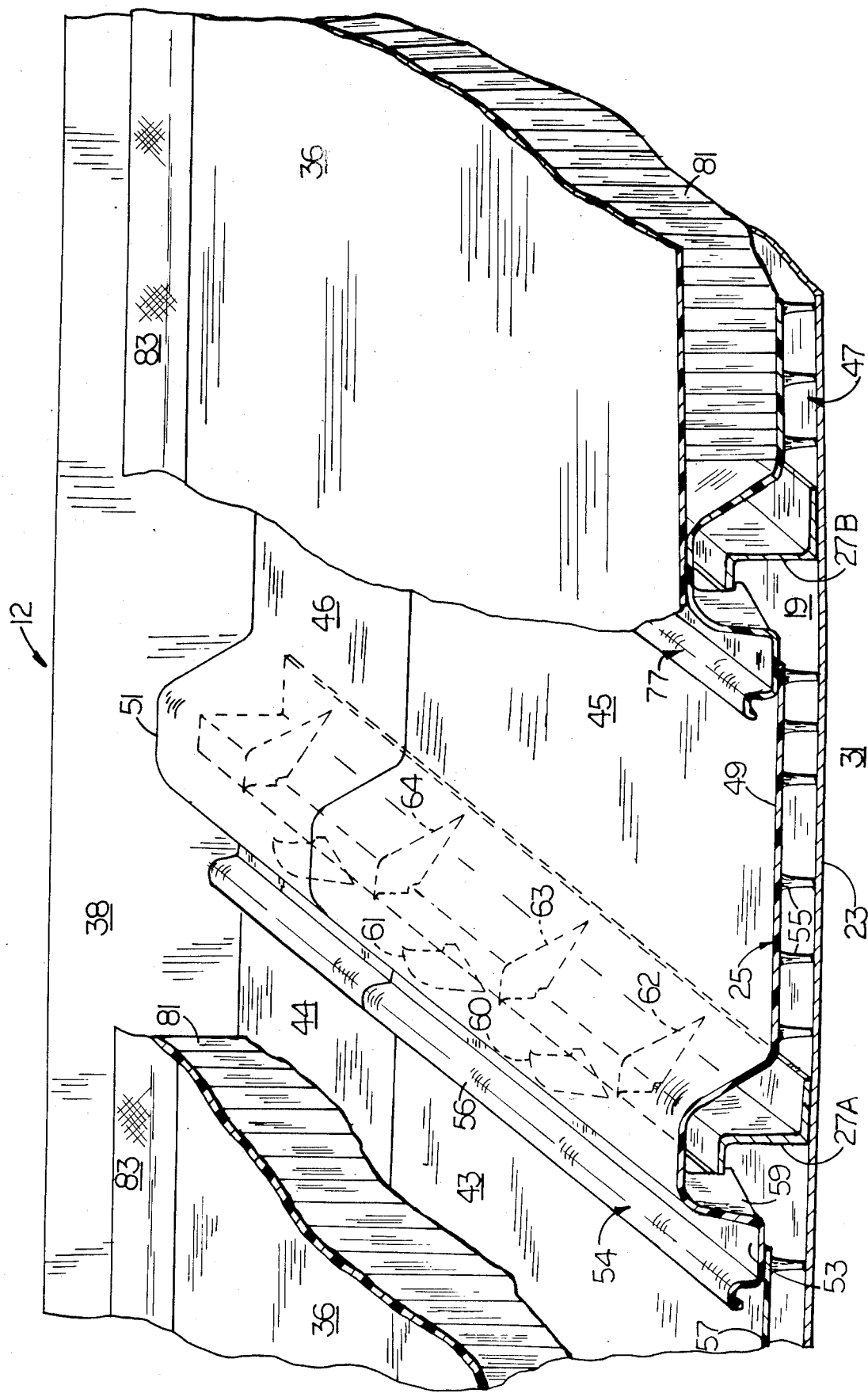
FIG. 5 is an enlarged fragmentary oblique sectional view of the area of the preferred embodiment enclosed by arrow 4 in FIG. 3.
Figure 7:
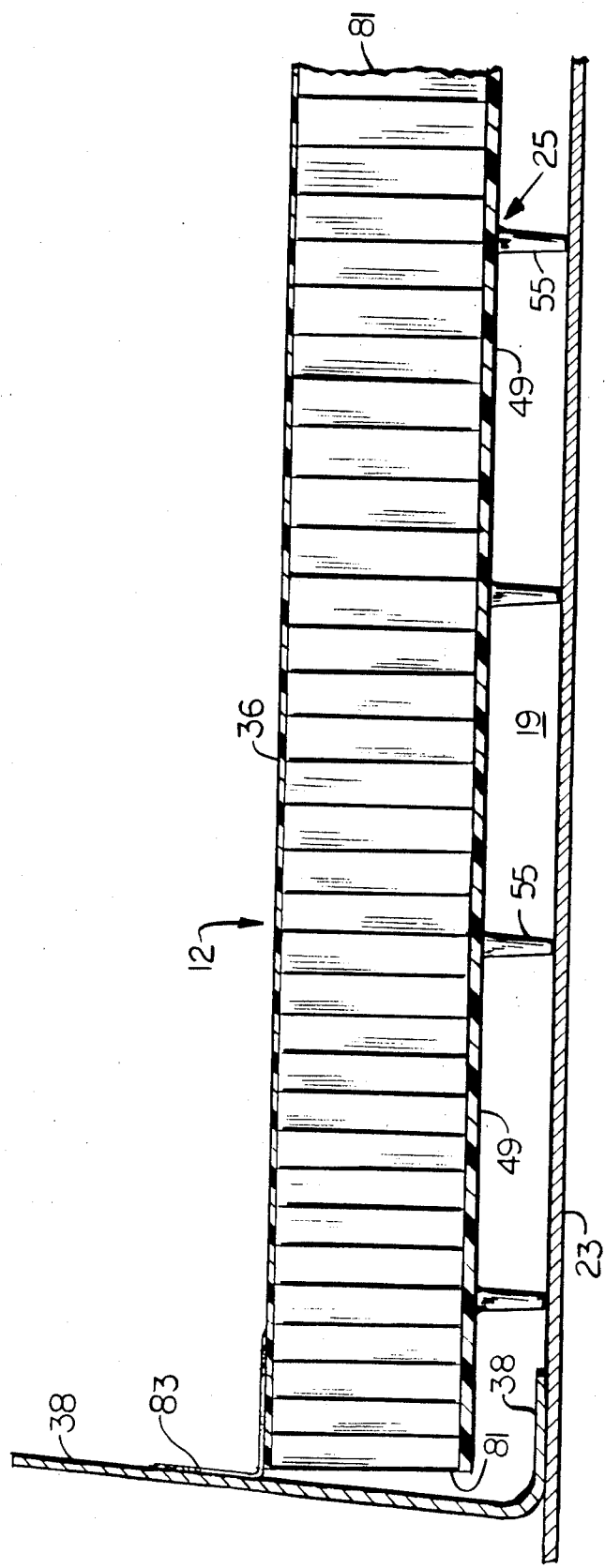
FIG. 7 is an enlarged fragmentary sectional view taken along line 7 in FIG. 4.

FIG. 4 is an enlarged fragmentary sectional view of the area enclosed by arrow 4 in FIG. 3, but for preferred embodiment 12 of the present invention, an embodiment designed to deal with the more complicated, but typical situation of an aircraft having a plurality of transverse annular support frames. As also shown in FIGS. 5 and 7, frame 38 is representative of a plurality of parallel annular support frames abuttingly attached to skin 23 at various axial stations in between aft bulkhead 30 and the forward bulkhead. In preferred embodiment 12, liner 25 and envelope 19 are comprised of a plurality of juxtaposed liners and envelopes located in small transverse bays separated by annular support frames, rather than being one unbroken liner 25 and envelope 19 running from aft bulkhead 30 to the forward bulkhead, as is the case for preferred embodiment 11.

Liner 25 is comprised of abutting liner sections produced by the process of injection molding using a heat and flame resistant material that is flexible and capable of being trimmed. The capability to tailor each section is particularly important because the distance between aircraft bulkheads, as well as the usual spacing between annular support frames, typically exceeds the maximum liner section width obtainable through injection molding. In addition, the space between the annular frames varies because they become more closely spaced as the nose of the aircraft is approached. Similarly, longerons 27 deviate from parallelism and the space between them decreases because they converge as they approach the nose of the aircraft.

To provide sufficient liner width between bulkheads, between annular support frames, or between a frame and a bulkhead, a plurality of liner sections are placed transversely abutting each other, and one or all of them may be trimmed to suit the precise geometry of any application or situation. In particular, FIG. 5 shows a plurality of liner sections in transverse abutment in order to provide the requisite width between frame 38 and another parallel frame or bulkhead (not shown). Liner sections 43 and 45 are in transverse abutment with sections 44 and 46, respectively; sections 43 and 45 have a full, untrimmed width, while sections 44 and 46 have been trimmed to fit snuggly in between liner sections 43 and 45, and frame 38.

As is the case for preferred embodiment 12, where frame 38 is higher than the level of liner cover 36, that is, higher than the highest projection of liner 25 (the height of the convex ridges of liner 25 which cover longerons 27), liner cover 36 must also be cut into sections and trimmed to fit snugly where it transversely abuts on both sides of frame 38.

In situations where frame 38 is not as high as the level of liner cover 36, there is no need to cut and trim liner cover 36 other than where it abuts the forward and aft bulkheads. However, various liner sections of liner 25 must still be trimmed to obtain a tight fit where they abut frame 38, other liner sections, and the forward and aft bulkheads, as previously discussed.

FIG. 4 details a representative liner section, section 45, and the lateral relationship between three consecutive liner sections, sections 43, 45, and 47, that are representative of the liner sections comprising liner 25. Liner section 45 is comprised of three contiguous parts; level 49, convex ridge 51 and lip 53.

Level 49 has a plurality of posts 55 extending perpendicularly downward from its bottom surface and resting upon fuselage skin 23, thereby supporting level 49 above fuselage skin 23 and providing an air passage. The height of the air passage is a value calculated to provide optimal heat exchange by convection between the hot air flowing through the passage and skin 23, and may be theoretically determined by methods well known in the art. Alternatively, as posts 55 are composed of a flexible material that can be cut, they may be molded to a maximum height and then progressively shortened for a series of tests to empirically determine the optimal passage height.

Posts 55 also serve to create turbulence in the flow of air through the air passage created by liner 25 and fuselage skin 23, and thereby increase the heat transfer between the hot air and fuselage skin 23.

Longerons 27A and 27B are representative of longerons 27. Convex ridge 51 is shaped to fit over longeron 27A and maintain an air passage height between convex ridge 51 and longeron 27A approximating the optimal air passage height between level 49 and skin 23.

Convex ridge 51 has two opposing faces which run the longitudinal length of the ridge, forward face 52 and aft face 50. Forward face 52 is the face adjoining lip 53, and aft face 50 is the face adjoining level 49. Molded as a part of convex ridge 51 are a plurality of vertical transverse ribs that alternately extend from forward face 52 and aft face 50, and function to removably attach liner section 45 to longeron 27A.

Figure 8:
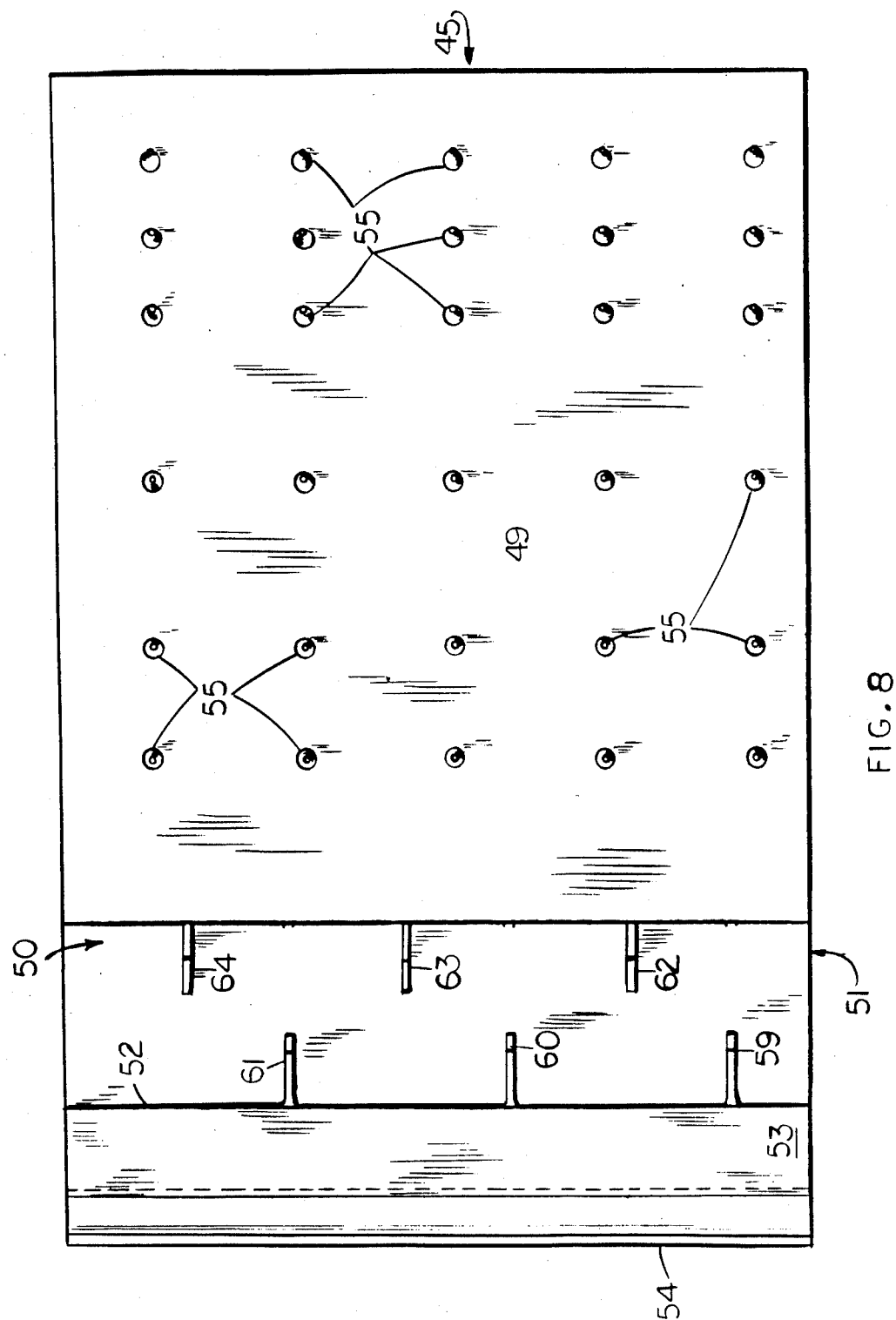
FIG. 8 is a bottom view of a liner section of a preferred embodiment of the present invention.

The relationship of the ribs to convex ridge 51, as well as that of posts 55 to level 49, is provided by FIG. 8, a bottom view of liner section 45. Attachment ribs 59, 60 and 61 extend from the forward face 52 of convex ridge 51, while notch ribs 62, 63 and 64 extend from aft face 50 of convex ridge 51. All of the ribs are perpendicular to level 49, and notch ribs and attachment ribs alternate, with each rib being in between and equidistant from the nearest pair of ribs on the opposite face of convex ridge 51.

Figure 6:
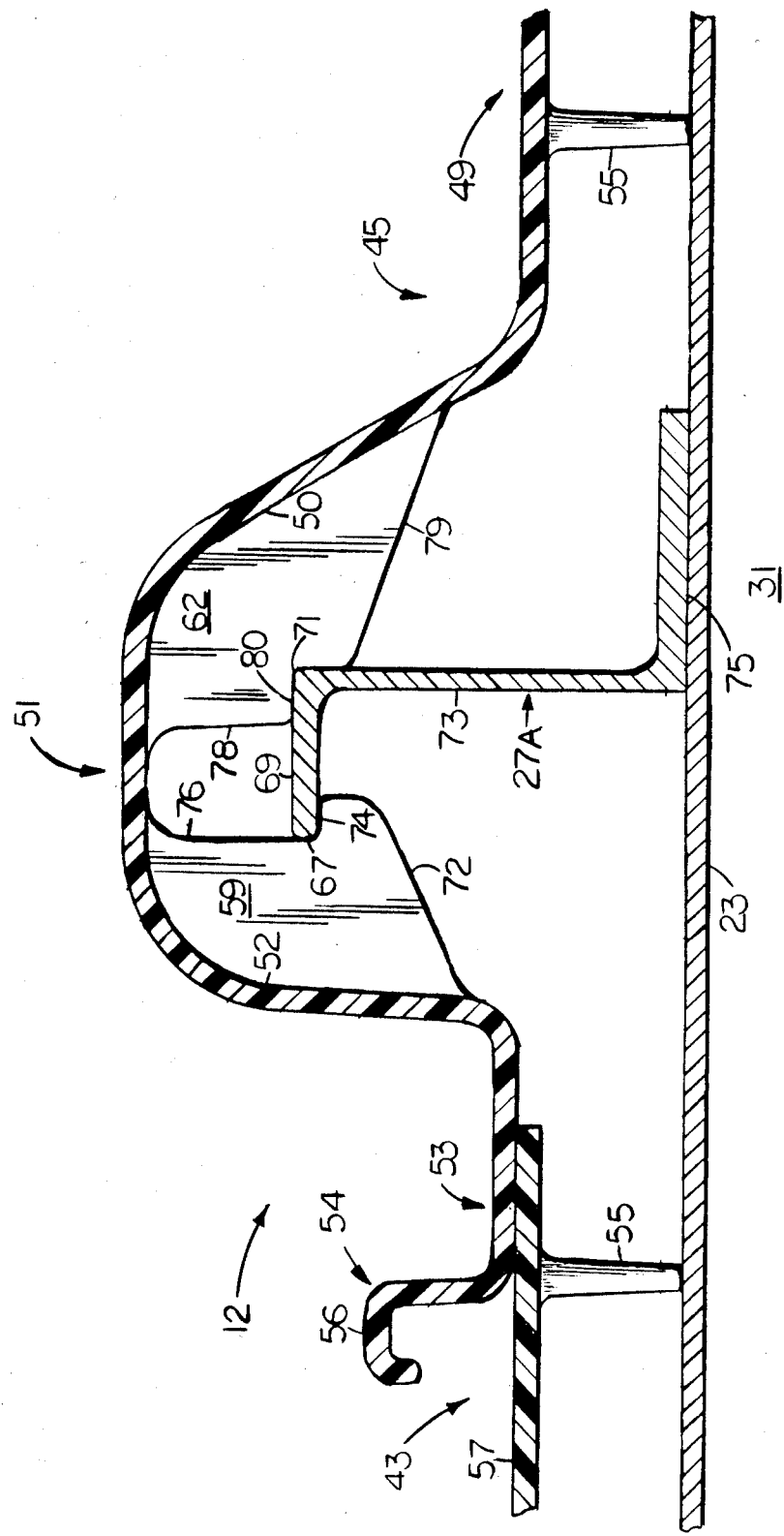
FIG. 6 is an enlarged sectional view of the area of the preferred embodiment enclosed by arrow 6 in FIG. 4.

As particularly shown in FIG. 6, longeron 27A is abuttingly attached to skin 23 along horizontal attachment member 75, and is otherwise comprised of vertical member 73, elbow 71, horizontal cantilever 69, and unconnected cantilever end 67.

Vertical member 73 extends perpendicularly from horizontal attachment member 75. Horizontal cantilever 69 extends perpendicularly from the upper extremity of vertical member 73, and the perpendicular junction of horizontal cantilever 69 with vertical member 73 forms elbow 71.

Also shown in detail are the profiles of aft face 50 and forward face 52 of convex ridge 51, notch rib 62, attachment rib 59, lip 53, and lip handle 54, all parts of liner section 45; and level 57 of adjacent liner section 43.

Notch rib 62 and attachment rib 59 are parallel and extend transversely from aft face 50 and forward face 52, respectively, of convex ridge 51.

Aft vertical surface 78 of notch rib 62 extends vertically downward from convex ridge 51 and is connected at its lower extremity to notch 80, which is a right angle notch in notch rib 62 and positioned to abuttingly accept elbow 71 of longeron 27A when convex ridge 51 is attached to longeron 27A. Aft beveled surface 79 is connected at its upper extremity to notch 80, and at its lower extremity to aft face 50 of convex ridge 51.

Forward vertical surface 76 of attachment rib 59 extends vertically downward from convex ridge 51 and is connected at its lower extremity to level ledge 74. Level ledge 74 extends perpendicularly from the lower extremity of forward vertical surface 76, towards aft face 50 of convex ridge 51, and is connected at its extremity nearest aft face 50 to the upper extremity of forward beveled surface 72. When convex ridge 51 is attached to longeron 27A, the lower surface of horizontal cantilever 69 abuts level ledge 74, and unconnected cantilever end 67 either abuts or is slightly apart from the lower part of forward vertical surface 76. Forward beveled surface 72 is connected at its lower extremity to forward face 52 of convex ridge 51.

The material comprising liner section 45 and, therefore, attachment rib 59, is flexible and compressible.

To install liner section 45, convex ridge 51 is placed above longeron 27A, with forward beveled surface 72 abutting unconnected cantilever end 67. Force directed normally toward skin 23 is then applied to the top of convex ridge 51 (by pressing with the heel of one's hand, for example). Sufficient force is applied to compress forward beveled surface 72, the part of attachment rib 59 underlying forward beveled surface 72, and level ledge 74, and cause forward beveled surface 72 to slide over unconnected cantilever end 67 and downward toward skin 23 until level ledge 74 becomes co-planar with the lower surface of horizontal cantilever 69; whereupon forward beveled surface 72, level ledge 74, and the underlying part of attachment rib 59, no longer under compression, expand outward to take up their original, uncompressed, joint configuration; while, simultaneously, notch 80 of notch rib 62 abuttingly accepts elbow 71, thus trapping horizontal cantilever 69 between notch 80, level ledge 74, and forward vertical surface 76.

As is the case with all of the liner sections, liner section 43 is molded with a bending bias in level 57 similar to that of a leaf spring which, when section 43 is not installed and left free standing, causes level section 57 to curl upward from the horizontal in a concave arc, resulting in the vertical displacement of the free end of level 57 above the horizontal plane. The installation of liner section 43 precedes the installation of liner section 45 which, in turn, is followed by the installation of liner section 47. Upon the installation of convex ridge 51 of liner section 45 onto longeron 27A, lip 53 overlaps the end of level 57 of liner section 43, trapping the end of level 57 between lip 53 and skin 23. The horizontal position of level 57 results in a force, emanating from the bending bias of level 57 in attempting to return to its free standing concave arc configuration, being exerted by level 57 upwards against lip 53. This force compresses level ledge 74 up against the lower surface of horizontal cantilever 69, securing the engagement of horizontal cantilever 69 by convex ridge 51 and making it less subject to inadvertent disengagement due to vibration or shock.

Lip 53 includes lip handle 54 and horizontal lip handle member 56. Removal of convex ridge 51 from longeron 27A is obtained by the application of a lateral force against lip handle 54 directed away from longeron 27A, causing the horizontal movement of level ledge 74 away from vertical member 73 of longeron 27A. When level ledge 74 has been moved a sufficient horizontal distance to clear unconnected cantilever end 67, the application of a vertical force directed away from skin 23 against the lower surface of horizontal lip handle member 56, together with the vertical upward force emanating from the concave bias of level 57, will cause the upward displacement of level ledge 74 past unconnected cantilever end 67, releasing attachment rib 59 from horizontal cantilever 69, and effecting the disengagement of convex ridge 51 and section 45 from longeron 27A.

The notch ribs and attachment ribs are alternately positioned in order to minimize the torsional rigidity of converse ridge 51 along the vertical transverse planes of the respective attachment ribs, and thereby facilitate removal and installation of convex ridge 51.

Figure 9:
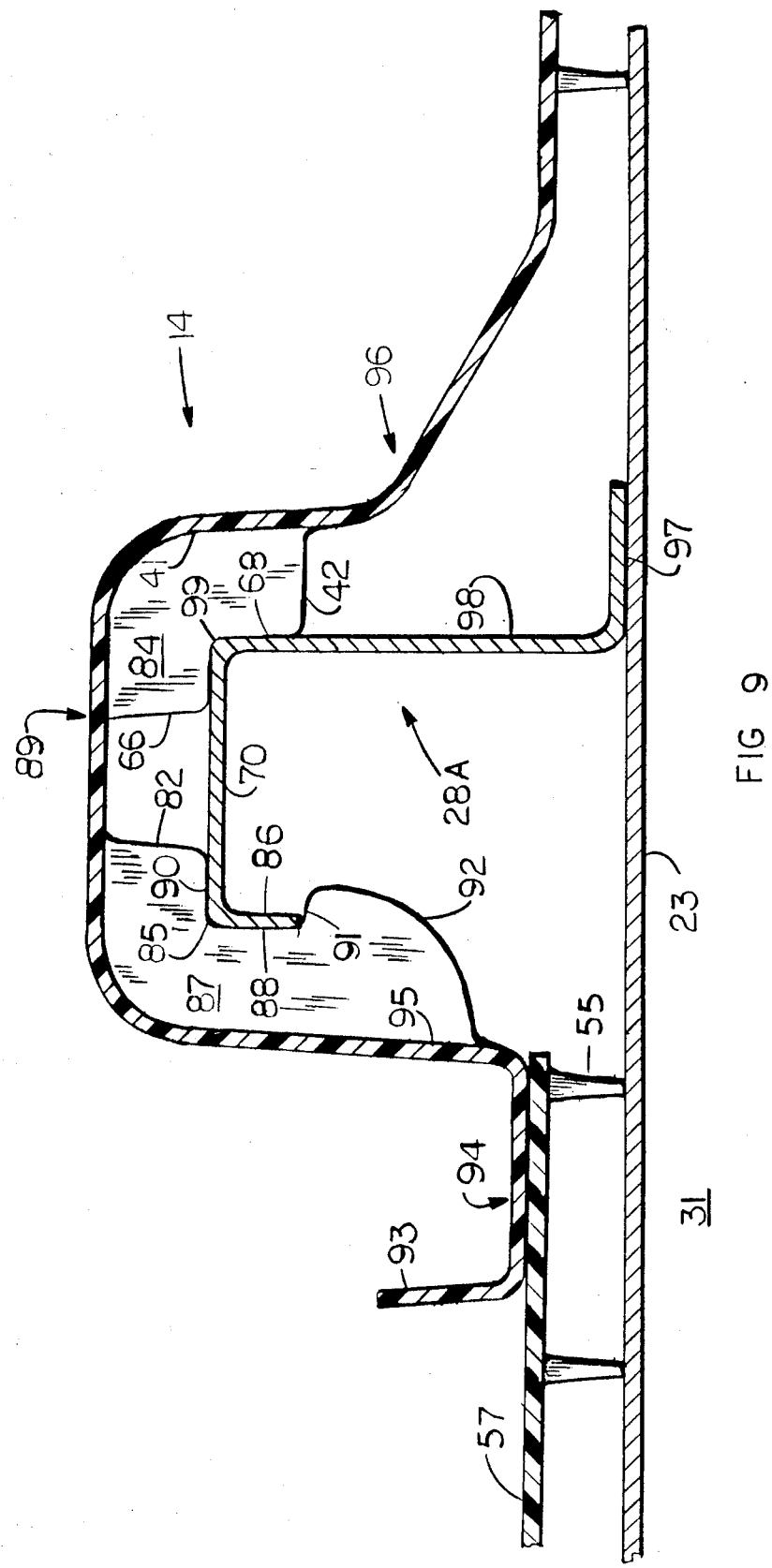
FIG. 9 is an enlarged sectional view of the area enclosed by arrow 6 in FIG. 4, but for a preferred embodiment different than the preferred embodiment shown in FIG. 4.

FIG. 9 illustrates an enlarged sectional view of the area enclosed by arrow 6 in FIG. 4, but for preferred embodiment 14 of the present invention. As may be discerned by comparing FIG. 9 with FIG. 6, preferred embodiment 14 differs from preferred embodiment 12 in the shape of the longerons and the configurations of the convex ridge, attachment rib, and lip handle of the liner sections. More particularly, modified longeron 28A is abuttingly attached to skin 23 along horizontal attachment member 97, and is otherwise comprised of vertical member 98, elbow 99, horizontal longeron member 70, flange elbow 85, and flange 86.

Vertical member 98 extends perpendicularly from horizontal attachment member 97. Horizontal longeron member 70 extends perpendicularly from the upper extremity of vertical member 98, and the perpendicular junction of horizontal longeron member 70 with vertical member 98 forms elbow 99. Flange 86 extends perpendicularly downward from the lateral extremity of horizontal longeron member 70, and the perpendicular junction of flange 86 with horizontal longeron member 70 forms flange elbow 85. Convex ridge 89 of liner section 96 is removably attached to modified longeron 28A, and includes attachment rib 87, notch rib 84, forward face 95 and aft face 41. Notch rib 84 and attachment rib 87 are parallel and extend transversely from aft face 41 and forward face 95, respectively, of convex ridge 89.

Attachment rib 87 is flexible and contoured, and includes forward vertical surface 82, cup depression 88, and parabolic surface 92. Cup depression 88 includes two parallel sides, upper cup wall 90 and lower cup wall 91. Forward vertical surface 82 is connected at its upper extremity to convex ridge 89, and at its lower extremity to the lateral extremity of upper cup wall 90. Parabolic surface 92 adjoins and falls downwardly away from the lateral extremity of the lower cup wall 91, and is connected at its lower extremity to forward face 95 of convex ridge 89.

Notch rib 84 is comprised of aft vertical surface 66, notch 68, and horizontal notch rib surface 42. Aft vertical surface 66 extends vertically downward from convex ridge 89 and is connected at its lower extremity to notch 68. Notch 68 is a right angle notch in notch rib 84 and is positioned to abuttingly accept elbow 99 of longeron 28A when convex ridge 89 is attached to longeron 28A. Horizontal notch rib surface 42 is connected to notch 68 at its lateral extremity closest to forward face 95, and is connected to aft face 41 of convex ridge 89 at its lateral extremity closest to aft face 41.

When convex ridge 89 is attached to modified longeron 28A, cup depression 88 accepts and abuts flange 86 and flange elbow 85, and notch 68 abuttingly accepts elbow 99.

To install liner section 96 of preferred embodiment 14, convex ridge 89 is placed above modified longeron 28A, with parabolic surface 92 abutting flange elbow 85. Force directed normally toward skin 23 is then applied to the top of convex ridge 89 (by pressing with the heel of one's hand, for example). Sufficient force is applied to compress parabolic surface 92, the part of attachment rib 87 underlying parabolic surface 92, and lower cup wall 91, and cause parabolic surface 92 to slide over flange elbow 85 and downward towards skin 23 until lower cup wall 91 is slightly below the unconnected lower extremity of flange 86; whereupon parabolic surface 92, lower cup wall 91, and the underlying part of attachment rib 87, no longer under compression, expand outward to take up their original, uncompressed, joint configuration; while, simultaneously, notch 68 of notch rib 84 abuttingly accepts elbow 99, thus trapping flange 86 in cup depression 88.

Lip 94 includes modified lip handle 93, which is a vertical member extending perpendicularly from the lateral extremity of lip 94. Removal of convex ridge 89 from modified longeron 28A is obtained by the application of a lateral force against modified lip handle 93 directed away from modified longeron 28A, causing the horizontal movement of lower cup wall 91 away from flange 86. When lower cup wall 91 has been moved a sufficient horizontal distance to clear the unconnected lower extremity of flange 86, the application of a vertical force directed away from skin 23 to modified lip handle 93, together with the upward vertical force emanating from the concave bias of the adjacent level 57, will result in the upward displacement of lower cup wall 91 past the unconnected lower extremity of flange 86, releasing flange 86 from cup depression 88 and effecting the disengagement of convex ridge 89 and liner section 96 from modified longeron 28A.

As previously stated, each liner section is transversely abutted by another liner section, an annular frame, or a bulkhead. In all of these situations, a seal must be effected in order to maintain the pressure differential between plenum 35 and envelope 19. As shown in FIGS. 4, 5 and 7, the apparatus used to effect the seal is comprised of filler 81, liner cover 36, and tape 83.

Filler 81 is a rigid honeycomb material trimmed to fit between consecutive frames, or between a frame and a bulkhead, or between the forward and aft bulkheads. Filler 81 is also trimmed laterally to fit between lip handle 77 of liner section 47 and convex ridge 51 of liner section 45. Filler 81 rests on top of the levels of the respective liner sections, and liner cover 36 abuts the top of filler 81 and the tops of the convex ridges of the respective liner sections.

As previously discussed, liner cover 36 is also trimmed to obtain a snug fit in any of a variety of abutment situations.

At the abutment of liner cover 36 with frame 38, tape 83 is applied for the length of the abutment to obtain an airtight seal. Tape 83 is similarly applied to provide an airtight seal where liner cover 36 abuts a bulkhead.

This seal serves to remedy any leakage that might otherwise occur in the transverse abutments of liner sections with each other, with frames, or with bulkheads, and thus maintains the pressure differential between plenum 35 and envelope 19 needed to force the hot air through envelope 19.

The air flowing into containers 15 and 16 from envelope 19 may be augmented with cool air obtained from conventional means in situations where the ambient temperature and flight parameters would otherwise fail to provide for the transfer of sufficient heat from the hot air flowing through envelope 19 to adequately cool avionics equipment 13; for example, while taxiing prior to take-off, during take-off, and while climbing after take-off.

What is claimed is:

1. Structure forming part of a heat exchanger comprising:
    (a) a flexible contoured shell;
    (b) said shell having parallel straight convex ridges and level sections;
    (c) said convex ridges being separated by and projecting above the level of said level sections;
    (d) spaced posts extending generally normally from said level sections in a direction opposite that of the projection of said convex ridges;
    (e) said convex ridges having ribs running transverse to said convex ridges; and
    (f) means for attaching said ribs to structural members by flexing.

2. The invention as defined in claim 1 wherein:
    (a) said contoured shell is comprised of a plurality of abutting shell sections;
    (b) each of said shell sections is comprised of one of said convex ridges, one of said level sections, and a lip;
    (c) said level section has a top level surface and a bottom level surface;
    (d) said posts extend from said bottom level surface, and said top level surface faces the direction opposite that of said bottom level surface;
    (e) said convex ridge has two opposing faces, a forward face and an aft face;
    (f) said lip:
        extends from the base of said forward face of said convex ridge in a direction away from said convex ridge;
        is planar; and
        has a bottom lip surface facing the same direction as said bottom level surface and being locally co-planar with said top level surface;
    (g) said convex ridge adjoins said level section at the base of said aft face; and
    (h) said convex ridge has at least one of said transverse ribs.

3. The invention as defined in claim 2 wherein:
    (a) said convex ridge has a crown located between and respectively adjoining said aft face and said forward face;
    (b) said transverse rib is comprised of a notch section and an attachment section;
    (c) said notch section is comprised of:
        an aft planar surface;
        a notch; and
        an aft beveled surface;
    (d) said aft planar surface:
        is attached to and extends from said crown in a direction generally perpendicular to the plane containing said bottom lip surface; and is connected at its extremity lying closest to said plane containing said bottom lip surface, to said notch;
(e) said notch is comprised of a first notch face and a second notch face;
said first notch face is generally parallel to said bottom lip surface and is connected to said aft planar surface at the extremity of said first notch face lying closest to said forward face of said convex ridge;
said second notch face is generally perpendicular to the plane containing said bottom lip surface and is connected to said aft beveled surface at the extremity of said second notch face lying closest to the plane containing said bottom lip surface; and
the extremity of said first notch face lying closest to said aft face and the extremity of said second notch face lying farthest away from the plane containing said bottom lip surface are connected to each other and form a right angle;
(f) said aft beveled surface:
is connected at its extremity lying farthest away from said plane containing said bottom lip surface to said second notch face; and
is connected at its extremity lying closest to the plane containing said bottom lip surface to said aft face.
(g) said attachment section is comprised of:
a forward planar surface;
a ledge; and
a forward beveled surface;
(h) said forward planar surface:
is attached to and extends from said crown in a direction generally perpendicular to the plane containing said bottom lip surface;
lies closer to said forward face in comparison to said aft planar surface; and
is connected at its extremity lying closest to the plane containing said bottom lip surface to said ledge;
(i) said ledge:
is a surface lying generally parallel to said bottom lip surface;
is connected at its extremity lying closest to said forward face to said forward planar surface; and
is connected at its extremity lying closest to said aft face to said forward beveled surface; and
(j) said forward beveled surface:
is connected at its extremity lying farthest away from the plane containing said bottom lip surface to said ledge; and
is connected at its extremity lying closest to the plane containing said bottom lip surface to said forward face.

4. The invention as defined in claim 1 wherein:
(a) said ribs are comprised of notch sections and flexible attachment sections; and
(b) said attachment means are comprised of said flexible attachment sections.

5. The invention as defined in claim 1 wherein:
(a) said contoured shell is comprised of a plurality of abutting shell sections;
(b) each of said shell sections is comprised of one of said convex ridges, one of said level sections, and a lip;
(c) said level section has a top level surface and a bottom level surface;
(d) said level section has a concave curvature relative to a point situated on a normal to said top level surface and located closer to said top level surface than to said bottom level surface.

6. The invention as defined in claim 2 further comprising:
(a) said lip having a lip handle comprised of:
a handle member;
a handle cantilever; and
a handle flange;
(b) said handle member being attached to the extremity of said lip lying farthest away from said convex ridge, and extending generally perpendicularly with respect to said bottom lip surface in the direction opposite to the direction that said bottom lip surface faces;
(c) said handle cantilever extending generally perpendicularly from the extremity of said handle member lying farthest away from said plane containing said bottom lip surface, in the direction away from said convex ridge; and
(d) said handle flange extending generally perpendicularly from the extremity of said handle cantilever lying farthest away from said convex ridge, in the direction towards said plant containing said bottom lip surface.

7. The structure recited in claim 1 wherein:
(a) said shell is comprised of a plurality of said shells situated adjoining each other; and
(b) said adjoining shells have means for flexibly and sealably engaging each other without the use of a fastener.

8. The invention as defined in claim 8 wherein:
said attachment means is a flexible ledge in each of said ribs.

9. Structure forming a heat exchanger comprising:
(a) a flexible shell;
(b) a wall opposing said shell and having projections;
(c) said shell having spacing means for maintaining a predetermined spacing between said shell and said wall; and
(d) said shell having flexible wall attachment means for removably attaching said shell to said projections by flexing.

10. The structure recited in claim 9 wherein:
(a) said shell has convex ridges and level sections;
(b) said ridges being separated by and projecting bove said level sections; and
(c) each of said ridges fitting over and being spaced apart from one of said projections.

11. The structure recited in claim 10 wherein:
said spacing means is spaced posts extending from said level sections.

12. The structure recited in claim 11 wherein:
(a) said wall attachment means is flexible ribs located in said convex ridges; and
(b) said ribs flexibly and removably engage said projections.

13. The structure recited in claim 12 wherein:
(a) said ridges are straight;
(b) said projections are longerons; and
(c) each of said ribs lies transverse to the axis of said ridge in which it is located.

14. The structure recited in claim 13 wherein:
(a) said shell is comprised of a plurality of said shells situated adjoining each other; and (b) said adjoining shells have means for flexibly and sealably engaging each other without the use of a fastener.

15. The structure recited in claim 14 further comprising a coolant medium, wherein:
   (a) said structure and said wall form an envelope; and
   (b) said transverse ribs allow communication of said coolant medium across said longerons; whereby
   (c) said coolant medium flows continuously through the entirety of said envelope.

16. The structure recited in claim 15 wherein:
   said wall is the external skin of a flight vehicle.

17. Structure forming part of a heat exchanger comprising:
   (a) a plurality of flexible contoured shells situated adjoining each other;
   (b) each of said shells having parallel straight convex ridges and level sections;
   (c) said convex ridges being separated by and projecting above the level of said level sections;
   (d) spaced posts extending generally normally from said level sections in a direction opposite that of the projection of said convex ridges; and
   (e) a prestressed bias in each of said level sections which causes said level section to have a concave curvature when it is not engaged with an adjoining shell; whereby
   (g) said adjoining shells are flexibly and sealably engaged to each other without the use of fasteners.

* * * * *